United States Patent
Yoo et al.

(10) Patent No.: US 9,287,445 B2
(45) Date of Patent: Mar. 15, 2016

(54) NANO-STRUCTURED LIGHT-EMITTING DEVICES

(71) Applicant: SAMSUNG ELECTRONICS CO., LTD., Suwon-si, Gyeonggi-do (KR)

(72) Inventors: Geon-wook Yoo, Seongnam-si (KR);
Nam-goo Cha, Ansan-si (KR);
Dong-koog Lee, Pocheon-si (KR);
Dong-hoon Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 56 days.

(21) Appl. No.: 14/106,186

(22) Filed: Dec. 13, 2013

(65) Prior Publication Data

US 2014/0166974 A1    Jun. 19, 2014

(30) Foreign Application Priority Data

Dec. 14, 2012  (KR) .................. 10-2012-0146620

(51) Int. Cl.
*H01L 29/06* (2006.01)
*H01L 33/08* (2010.01)
*H01L 33/24* (2010.01)
*H01L 27/15* (2006.01)

(52) U.S. Cl.
CPC ............ *H01L 33/08* (2013.01); *H01L 33/24* (2013.01); *H01L 27/156* (2013.01)

(58) Field of Classification Search
CPC .......... H01L 33/24; H01L 33/18; H01L 33/08
USPC ................. 257/13; 438/20, 478, 481, 47, 149
See application file for complete search history.

(56) References Cited

U.S. PATENT DOCUMENTS

| 7,588,955 | B2 | 9/2009 | Huang et al. | |
|---|---|---|---|---|
| 7,947,989 | B2 | 5/2011 | Ha et al. | |
| 8,399,876 | B2 | 3/2013 | Kim | |
| 2004/0164312 | A1* | 8/2004 | Biwa et al. | 257/99 |
| 2011/0272723 | A1 | 11/2011 | Ha et al. | |
| 2012/0153252 | A1* | 6/2012 | Kim et al. | 257/13 |
| 2013/0313514 | A1* | 11/2013 | Hwang et al. | 257/13 |
| 2013/0313583 | A1* | 11/2013 | Hwang et al. | 257/88 |

FOREIGN PATENT DOCUMENTS

| CN | 1881630 A | 12/2006 |
|---|---|---|
| CN | 102263172 A | 11/2011 |
| EP | 1 727 216 A2 | 11/2006 |
| EP | 2 390 930 A2 | 11/2011 |
| EP | 2 410 582 A2 | 1/2012 |
| JP | 2007-123398 A | 5/2007 |

(Continued)

*Primary Examiner* — Jami M Valentine
(74) *Attorney, Agent, or Firm* — McDermott Will & Emery LLP

(57) ABSTRACT

A nano-structured light-emitting device includes a plurality of light-emitting nanostructures each having a resistant layer disposed thereon. The device includes a first semiconductor layer of a first conductivity type, and a plurality of nanostructures disposed on the first semiconductor layer. Each nanostructure includes a nanocore, and an active layer and a second semiconductor layer of a second conductivity type that enclose surfaces of the nanocores. An electrode layer encloses and covers the plurality of nanostructures A plurality of resistant layers are disposed on the electrode layer and each corresponds to a respective nanostructure of the plurality of nanostructures.

16 Claims, 18 Drawing Sheets

(56) References Cited

FOREIGN PATENT DOCUMENTS

| | | |
|---|---|---|
| JP | 2008-306156 A | 12/2008 |
| JP | 4740795 B2 | 8/2011 |
| JP | 2011-254078 A | 12/2011 |
| KR | 10-2006-0124833 A | 12/2006 |
| KR | 10-0658938 B1 | 12/2006 |
| KR | 10-2011-0131801 A | 12/2011 |
| TW | 200849650 A | 12/2008 |

* cited by examiner

NANO-STRUCTURED LIGHT-EMITTING DEVICES

CROSS-REFERENCE TO RELATED APPLICATION

This application claims the benefit of priority to Korean Patent Application No. 10-2012-0146620, filed on Dec. 14, 2012, in the Korean Intellectual Property Office, the entire contents of which are hereby incorporated by reference.

TECHNICAL FIELD

The present disclosure relates to nano-structured light-emitting devices and methods for manufacturing the same. More particularly, the present disclosure relates to nano-structured light-emitting devices having structures capable of improving electrical reliability, and methods for manufacturing such light-emitting devices.

BACKGROUND

A semiconductor light-emitting device such as a light-emitting diode (LED) or a laser diode (LD) uses an electroluminescence phenomenon, i.e., a phenomenon of emitting light from a material through an application of a current or a voltage. As electrons are combined with holes in an active layer of the semiconductor light-emitting device, energy corresponding to an energy band gap of the active layer may be emitted as light. Therefore, a wavelength of light generated by the semiconductor light-emitting device may vary according to a size of the energy band gap of the active layer.

SUMMARY

The inventive concepts provide a nano-structured light-emitting device that includes a plurality of nanostructures, relieves a concentration of a current onto a particular nano-structure, and prevents damage to the nano-structure light-emitting device caused by damage to one nanostructure or a plurality of nanostructures to improve electrical reliability.

According to an aspect of the inventive concept, a nano-structured light-emitting device includes: a first semiconductor layer of a first conductivity type, and a plurality of nanostructures disposed on the first semiconductor layer. Each nanostructure includes a nanocore, and an active layer and a second semiconductor layer of a second conductivity type that enclose surfaces of the nanocore. An electrode layer encloses and covers the plurality of nanostructures, and a plurality of resistant layers are disposed on the electrode layer. Each resistant layer corresponds to a respective nanostructure of the plurality of nanostructures.

The resistant layers may be disposed to cover portions of the nanostructures and are spaced apart from one another so as not to contact each other.

The resistant layers each have a resistance value that is greater than or equal to resistance values of the nanostructures.

The nano-structured light-emitting device may further include an insulating layer disposed between adjacent nanostructures to electrically insulate the resistant layer of one nanostructure from the resistant layers of the other nanostructures. The resistant layers may be disposed only on portions of the electrode layers that do not contact the insulating layer.

The nano-structured light-emitting device may further include a conductive layer disposed on the plurality of resistant layers to connect the plurality of nanostructures to one another in parallel.

The nanostructures may be electrically interconnected into a plurality of groups corresponding to a plurality of pixels. The pixels may be separated from one another by trenches.

An insulating material may be disposed in the trenches.

The nano-structured light-emitting device may further include a mask layer disposed on an upper surface of the first semiconductor layer and including through-holes. The nanocores may protrude from the through-holes.

The nano-structured light-emitting device may further include: a first electrode pad electrically connected to the first semiconductor layer; and a second electrode pad electrically connected to the conductive layer.

The nano-structured light-emitting device may further include a substrate disposed underneath the first semiconductor layer.

The nano-structured light-emitting device may further include a reflective layer configured to reflect light emitted from the active layers.

The nanostructures may have polypyramid shapes or rod shapes.

The nano-structured light-emitting device may include different nanostructures operative to emit light having different wavelength ranges.

According to another aspect of the inventive concepts, a nano-structured light-emitting device includes a first semiconductor layer doped to have a first conductivity type, and a mask layer disposed on the first semiconductor layer and comprising a plurality of through-holes. A plurality of nanostructures protrude through the plurality of through-holes, and each nanostructure includes a nanocore that is doped to have the first conductivity type, an active layer that encloses surfaces of the nanocore, and a second semiconductor layer that is doped to have a second conductivity type. An electrode layer encloses and covers the plurality of nanostructures, and a plurality of resistant layers are disposed on the electrode layer. Each resistant layer respectively corresponds to a nanostructure of the plurality of nanostructures, and is electrically insulated from other resistant layers.

Each active layer may include a quantum well structure that is stacked as $In_aGa_{1-a}N/Al_xIn_yGa_{1-x-y}N$ ($0 \le a,x,y \le 1$, $x+y<1$).

According to another aspect of the inventive concepts, a nano-structured light-emitting device includes a first semiconductor layer of a first conductivity type, and a plurality of nanostructures disposed on the first semiconductor layer. Each nanostructure comprises a nanocore having an active layer and a second semiconductor layer of a second conductivity type enclosing a surface of the nanocore. A plurality of electrode layers are each disposed on a corresponding nanostructure of the plurality of nanostructures to enclose the nanostructures. A resistant layer is disposed on the plurality of electrode layers and is electrically connected to each of the plurality of electrode layers.

The plurality of nanostructures may be spaced apart from each other on the first semiconductor layer, and the plurality of electrode layers may be spaced apart from each other on corresponding nanostructures.

The nano-structured light-emitting device may further include a conductive layer disposed on the resistant layer to provide an electrical contact to each of the plurality of nanostructures.

Nanostructures may be disposed on the first semiconductor layer so as to be separated into a plurality of groups by trenches, and the nanostructures in each group may be electrically interconnected by a resistant layer connected to each of the nanostructures in the group.

BRIEF DESCRIPTION OF THE DRAWINGS

Exemplary embodiments of the inventive concepts will be more clearly understood from the following detailed description taken in conjunction with the accompanying drawings.

DETAILED DESCRIPTION

Figure 1A:
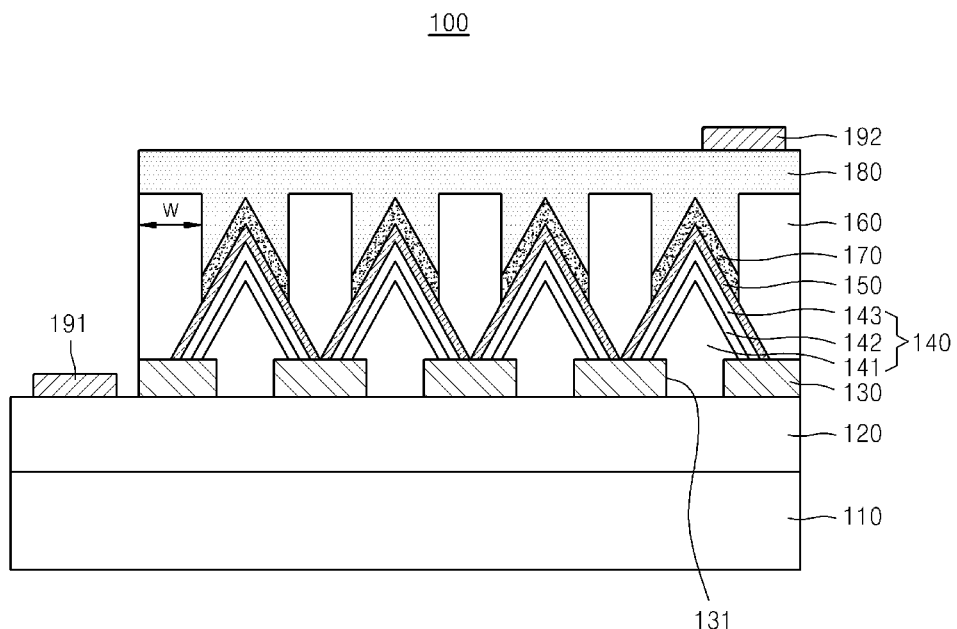
FIG. 1A is a schematic cross-sectional view illustrating a structure of a nano-structured light-emitting device according to an exemplary embodiment of the inventive concepts.

As used herein, the term "and/or" includes any and all combinations of one or more of the associated listed items. Expressions such as "at least one of," when preceding a list of elements, modify the entire list of elements and do not modify the individual elements of the list.

The inventive concepts will now be described more fully with reference to the accompanying drawings, in which exemplary embodiments of the inventive concepts are shown. The inventive concepts may, however, be embodied in many different forms and should not be construed as being limited to the embodiments set forth herein; rather, these embodiments are provided so that this disclosure will be thorough and complete, and will fully convey the inventive concepts. Like reference numerals in the drawings denote like elements, and thus their description will be omitted. In the drawings, the thicknesses of layers and regions are exaggerated for clarity. It will also be understood that when a layer is referred to as being "on" another layer or substrate, it can be directly on the other layer or substrate, or intervening layers may also be present.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. It will be understood that, although the terms, 'first', 'second', etc. may be used herein to describe various elements, these elements should not be limited by these terms. These terms are only used to distinguish one element from another.

If any exemplary embodiment is differently realized, an order of a particular process may be performed differently from a described order. For example, two processes that are consecutively described may be actually simultaneously performed or may be performed in an opposite order from a described order.

Figure 1B:
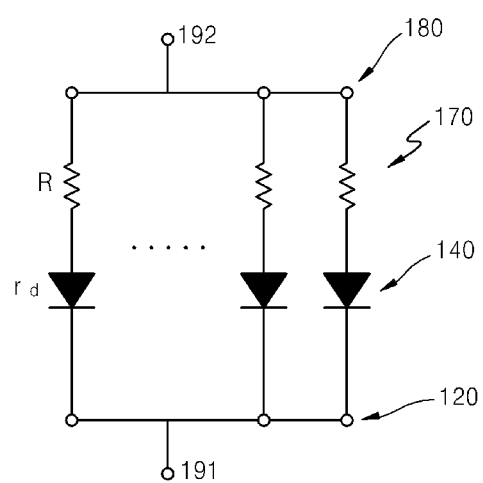
FIG. 1B is a schematic circuit diagram illustrating the nano-structured light-emitting device of FIG. 1A.

FIG. 1A is a schematic cross-sectional view illustrating a structure of a nano-structured light-emitting device 100 according to an exemplary embodiment of the inventive concepts. FIG. 1B is a circuit diagram of the nano-structured light-emitting device 100 of FIG. 1A.

Referring to FIGS. 1A and 1B, the nano-structured light-emitting device 100 includes a first semiconductor layer 120 having a first conductivity type, a plurality of nanostructures 140, an electrode layer 150, and a plurality of resistant layers 170. The nano-structured light-emitting device 100 may further include a substrate 110, a mask layer 130, an insulating layer 160, a conductive layer 180, a first electrode pad 191, and/or a second electrode pad 192.

In the present exemplary embodiment, each resistant layer 170 may reduce a concentration of current on a corresponding particular one of the plurality of nanostructures 140 and may prevent damage to the nano-structured light-emitting device 100 caused by damage to the particular one of the plurality of nano-structures 140.

The structure of the nano-structured light-emitting device 100 including the nanostructures 140 provides a smaller contact area between the nanostructures 140 and the substrate than the contact area provided in a light-emitting device having a thin film form. The light-emitting device 100 may thus incur a low lattice constant inconsistency or a low difference in a thermal expansion coefficient, e.g. between the substrate and the nanostructures. As a result, the nano-structured light-emitting device 100 may have a structure that reduces the occurrence of crystal defects. Additionally, the nano-structured light-emitting device 100 is manufactured such that each light emitting structure (e.g., each nanostructure 140) has a 3-dimensional (3D) form and thus has a larger light-emission surface area than the light-emission surface area provided in a thin film light-emitting device having the same footprint, thereby increasing light efficiency.

The nano-structured light-emitting device 100 may include the plurality of nanostructures 140. For example, the nano-structured light-emitting device 100 may include one or more dozens through one or more hundreds of nanostructures 140. Each nanostructure 140 may correspond to a diode having a size ranging from several (e.g., 1 or more) nanometers through several hundreds (e.g., 1 or more hundreds) of nanometer, and the nano-structured light-emitting device 100 may have a structure in which one or more dozens through one or more hundreds of diodes are connected to one device in parallel. In this case, uniformity of an electric characteristic of each of the diodes may be a factor that is very important to reliability of the whole device. In other words, if a difference in the electrical characteristic (an internal resistance or forward voltage characteristic) of one or more of the diodes occurs, a current may be concentrated into a particular diode. The particular nanostructure 140 may be damaged by the concentration of the current, and the damage may in turn cause damage to the nano-structured light-emitting device 100.

In the present exemplary embodiment, the resistant layers 170 have resistances R equal to or greater than resistances $r_d$ of the nanostructures 140 and each resistant layer 170 is formed on a corresponding one of the plurality of nanostructures 140 to inhibit the current from being concentrated onto the corresponding nanostructure 140.

Referring to FIG. 1B, each resistance layer 170 having the resistance R is connected to the corresponding nanostructure 140 having the resistance $r_d$ in series. Also, the nanostructure 140 and the resistant layer 170 that are connected to each other in series are connected to other interconnections of a nanostructure 140 and a resistant layer 170 in parallel. In other words, one end of each nanostructure of the plurality of nanostructures 140 is connected to the first semiconductor layer 120 to be supplied with a voltage from the first electrode pad 191, and one end of each resistant layer of the plurality of resistant layers is connected to the conductive layer 180 to be supplied with a voltage from the second electrode pad 192.

If a voltage applied to the first and second electrode pads 191 and 192 is V, a current flowing in each of the nanostructures 140 may be expressed as $I=V/(r_d+R)$. Therefore, differences in the current flowing through different nanostructures 140, caused by non-uniformity of the resistance $r_d$ of each of the nanostructures 140, may be reduced by the additional resistance R connected in series with each nanostructure 140.

Therefore, the concentration of current onto any particular nanostructure 140 may be reduced by introduction of the resistance layers 170, and thus electrical reliability of the nano-structured light-emitting device 100 may be improved.

The structure of the nano-structured light-emitting device 100 will now be described in more detail.

The substrate 110 may be provided to grow the first semiconductor layer 120 having a first conductivity type and may be one of various types of substrates that are used in a general semiconductor device process. For example, the substrate 100 may be formed as a sapphire ($Al_2O_3$) substrate, a silicon carbide (SiC) substrate, an aluminum nitride (AlN) substrate, a silicon (Si)-aluminum (Al) substrate, or a nitride substrate. Alternatively, the substrate 110 may be a substrate formed of a material appropriate for growing the first semiconductor layer 120, for example, one selected from the group consisting of ZnO, GaAs, $MgAl_2O_4$, MgO, $LiAlO_2$, $LiGaO_2$, GaN, $ZrB_2$, GaP, diamond, and combinations thereof. However, this is exemplary, and other types of substrates may be used. The substrate 110 may be selectively removed after the nano-structured light-emitting device 100 is manufactured.

The first semiconductor layer 120 may include nitride containing gallium. The first semiconductor layer 120 may include $Al_xIn_yGa_{1-x-y}N$ ($0 \leq x \leq 1$, $0 \leq y \leq 1$ and $x+y<1$), for example, and may be formed of a material including one of GaN, InGaN, and AlInGaN. The first semiconductor layer 120 may have a multilayer structure and include a nuclear growth layer and/or a buffer layer for promoting growth. The first semiconductor layer 120 may be selectively undoped or doped. For example, the first semiconductor layer 120 may be an n-type semiconductor layer or a p-type semiconductor layer. Si, Ge, Se, Te, or the like may be used as n-type dopant, and B, Al, Mg, Ca, Zn, Cd, Hg, Ga, or the like may be used as p-type dopant.

The mask layer 130 is formed on the first semiconductor layer 120 and includes a plurality of through-holes 131 through which the first semiconductor layer 120 is partially exposed. The mask layer 130 may be patterned to grow the nanostructures 140 through the through-holes 131. The mask layer 130 may be etched and formed to have a desired pattern of through-holes 131 by using a lithography process. The through-holes 131 may have cross-sectional shapes (as seen from above in the orientation shown in FIG. 1A) including circular shapes, elliptical shapes, polygonal shapes, or the like. The mask layer 130 may be formed of an insulating material, for example, one or more of $SiO_2$, SiN, $TiO_2$, $Si_3N_4$, $Al_2O_3$, TiN, AlN, $ZrO_2$, TiAlN, and TiSiN.

Each nanostructure 140 includes a nanocore 141 that is grown from a selective area on the first semiconductor layer 120, and an active layer 142 and a second semiconductor layer 143 of a second conductivity type that are formed to enclose or substantially cover a surface of the nanocore 141. The second conductivity type is different from the first conductivity type. In other words, each nanostructure 140 may have a core-shell structure in which the nanocore 141 is a core part, and the active layer 142 and the second semiconductor layer 143 enclosing the nanocore 141 are shell parts.

The nanocores 141 may be formed of a semiconductor material that is doped with the same first conductivity type as that used to dope the first semiconductor layer 120, and may for example be formed of n-$Al_xGa_yIn_zN$ ($0 \leq x \leq 1$, $0 \leq y \leq 1$, $0 \leq z \leq 1$, $x+y+z=1$). Also, Si, Ge, Se, Te, or the like may be used as n-type dopants. The nanocores 141 may be vertically grown from the first semiconductor layer 120 through the through-holes 131 formed in the mask layer 130 and may have cross-sectional shapes such as circular shapes, elliptical shapes, polygonal shapes, or the like according to the cross-sectional shapes of the through-holes 131. Sizes of the plurality of through-holes 131 may be individually variously formed. Growth conditions of the nanostructures 140 may vary according to the sizes of the through-holes 131. Diameters of the through-holes 131 may be one or more dozens through one or more hundreds of nanometers.

As shapes of the through-holes 131 of the mask layer 130 and growth conditions of the nanocores 141 are adjusted, an outer shape formed by the nanocores 141 may be a pyramid shape, and surfaces on which the active layers 142 are grown may be semipolar surfaces such as a surface (11-22) or a surface (10-13). If active layers 142 having quantum well structures are grown in the semipolar surfaces, spontaneous polarization is reduced. Also, the active layers 142 have nanoscale sizes that relieve strain, and thus a polarization caused by a piezoelectric field effect is inhibited, thereby inhibiting a quantum confinement stark effect (QCSE), like in active layers that are grown from a non-polar surface. Therefore, a phenomenon that causes occurrence of crystal defects when a content of In of the active layers 142 increases is reduced, and it is easy to uniformly maintain the content of In.

The active layers 142 may be layers that emit light through a re-combination of electrons and holes. The active layers 142 may have structures in which quantum well layers and barrier layers are alternately stacked one or more times. Here, the quantum well layers may have single quantum well structures or multi-quantum well structures. For example, the quantum well layers may have single quantum well structures or multi-quantum well structures that are formed by variously changing x, y, and z values in $Al_xGa_yIn_zN$ to adjust a band gap. As another example, the quantum well layers and the barrier layers may be paired in a form InGaN/GaN, InGaN/InGaN, InGaN/AlGaN, or InGaN/InAlGaN to form the single quantum well structures or the multi-quantum well structures. Also, band gap energy is controlled according to a mole fraction of In in an InGaN layer to adjust an emission wavelength band. In general, when the mole fraction of In is changed by 1%, an emission wavelength is shifted by about 5 nm. The active layers 142 may be grown in radial shapes from the nanocores 141 to enclose surfaces of the nanocores 141. In exemplary embodiments, the active layers 142 may have thicknesses between several nanometers and dozens of nanometers, for example, between 8 nm and 80 nm.

The second semiconductor layers 143 of the second conductivity type are formed in shapes that enclose surfaces of the active layers 142. For example, the second semiconductor layers 143 may be formed of a III-V group semiconductor compound, for example a nitride semiconductor. The second semiconductor layers 143 may be formed of p-$Al_xIn_yGa_{1-x-y}N$ ($0<x,y<1$, $x+y<1$), and B, Al, Mg, Ca, Zn, Cd, Hg, Ga, or the like may be used as p-type dopant. However, this is exemplary, and the nanocores 141 may be doped with a second conductivity type, and the second semiconductor layers 143 may be doped with a first conductivity type. In exemplary embodiments, the second semiconductor layers 143 may have thicknesses between dozens of nanometers and hundreds of nanometers, for example, between 20 nm and 100 nm.

Electrons may be supplied to the active layers 142 from the nanocores 141, holes may be supplied to the active layers 142 from the second semiconductor layers 143, and the electrons and the holes may be combined in the active layers 142 to emit light. Here, light may be emitted through the surfaces of the nanostructures 140, and the nanostructures 140 have 3D shapes to have wider and larger areas emitting light than the areas provided in a thin film type light-emitting device formed in a 2-dimensional (2D) shape, thereby improving light emission efficiency. One nano-structured light-emitting device 100 may include nanostructures 140 having various sizes. Also, different nanostructures 140 may emit light having different wavelength ranges. In other words, the nanostructured light-emitting device 100 may realize a multi-wavelength light output.

The electrode layer 150 may be electrically connected to the second semiconductor layers 143 to inject holes or electrons into the active layers 142. If the second semiconductor layers 143 of the second conductivity type are doped with p-type dopant, the electrode layer 150 operates as a P electrode. If the second semiconductor layers 143 are doped with n-type dopant, the electrode layer 150 operates as an N electrode. The electrode layer 150 may be formed of various types of conductive materials. For example, the electrode layer 150 may be formed of Ag, Al, Ti, Ni, Au, Ti/Au, Ni/Au, Ni/Ag, or the like.

In exemplary embodiments, the electrode layer 150 may operate as a reflective layer that reflects light generated by the active layers 142 downwards to form a light-emission direction from the active layers 142 toward the first semiconductor layer 120. The electrode layer 150 may be formed of at least one or more of metallic elements such as Ag, $Ag_2O$, Al, Zn, Ti, Rh, Mg, Pd, Ru, etc. If light is reflected downwards as described above, the nano-structured light-emitting device 100 may be manufactured in a flip-chip shape.

According to another exemplary embodiment, the electrode 150 may be formed of transparent conductive oxide (TCO) to transmit light emitted from the nanostructures 140. For example, the electrode layer 150 may be formed of Indium tin Oxide (ITO), Aluminum Zinc Oxide (AZO), Indium Zinc Oxide (IZO), ZnO, GZO (ZnO:Ga), $In_2O_3$, $SnO_2$, CdO, $CdSnO_4$, or $Ga_2O_3$. In exemplary embodiments, the electrode layer 150 may have a thickness of hundreds of nanometers, for example, between 180 nm and 600 nm.

The resistant layers 170 are formed in shapes to enclose and cover the electrode layer 150 and respectively correspond to the plurality of nanostructures 140. The resistance R of each the resistant layer 170 may be greater than or equal to the resistance $r_d$ of the corresponding nanostructure 140 ($R \geq r_d$). For example, the resistances R of the resistant layers 170 may be values between one time and three times the resistances of the nanostructures 140. The resistant layers 170 may be formed of a material such as lightly-doped Si, polysilicon, silicide family, TaN, or the like. In exemplary embodiments, the resistant layers 170 may be formed to cover a portion of a surface of the electrode layer 150. The plurality of resistant layers 170 may be spaced apart from one another. In exemplary embodiments, resistant layers 170 may be formed to a thickness between dozens of nanometers and hundreds of nanometers. Thicknesses of the resistant layers 170 and areas of the resistant layers 170 formed on the electrode layer 150 may vary according to a material of the resistant layers 170 and may be determined in comparison with the resistances $r_d$ of the nanostructures 140.

The insulating layer 160 may be formed between the plurality of nanostructures 140. The insulating layer 160 may be formed to electrically insulate the resistant layers 170 formed on the plurality of nanostructures 140 from one another. A width w of the insulating layer 160 may be adjusted to adjust areas of the resistant layers 170 that cover each electrode layer 150. The width w of the insulating layer 160 may be dozens (e.g., 12 or more nanometers) through hundreds of nanometers (e.g., 100-900 nanometers). The insulating layer 160 may be formed of an insulating material such as $SiO_2$, SiN, or the like. In exemplary embodiments, the insulating layer 160 may be formed of insulating material having a light transmitting characteristic. For example, the insulating layer 160 may be formed of an oxide layer having high light transmissivity, and in more detail, may include $SiO_2$ or $Al_2O_3$. According to another exemplary embodiment, the insulating layer 160 may be formed of an insulating material that reflects light or an insulating material that does not have light transmissivity.

The conductive layer 180 is disposed on the mask layer 130 and encloses sides of the plurality of nanostructures 140. The conductive layer 180 also includes an area that is connected to the second electrode pad 192. The conductive layer 180 becomes a path through which a current is supplied to the resistant layers 170 and the nanostructures 140. The conductive layer 180 may be formed of various types of conductive materials. In exemplary embodiments, the conductive layer 180 may be formed of metal, for example, Ag, Al, Ti, Ni, Au, Ti/Au, Ni/Au, Ni/Ag, or the like. According to another exemplary embodiment, the conductive layer 180 may be formed of TCO to transmit light emitted from the nanostructures 140. For example, the conductive layer 180 may be formed of ITO, AZO, IZO, ZnO, GZO(ZnO:Ga), $In_2O_3$, $SnO_2$, CdO, $CdSnO_4$, or $Ga_2O_3$.

The first electrode pad 191 is electrically connected to the first semiconductor layer 120. The second electrode pad 192 is electrically connected to the conductive layer 180 to be electrically connected to the second semiconductor layers 143. In other words, the first and second electrode pads 191 and 192 are respectively electrically connected to the first semiconductor layer 120 and the second semiconductor layers 143 to apply a voltage for injecting electrons and holes into the active layers 142. The first and second electrode pads 191 and 912 may be formed of a transparent conductive material such as ITO, IZO, ZnO, $SnO_2$, or the like. However, the inventive concept is not limited thereto, and the first and second electrode pads 191 and 192 may be formed in a single layer including various types of opaque conductive materials, for example, one of Ag, Al, Ti, Ni, Au, Cr, Ti/Au, Ni/Au, and Ni/Ag or in a multilayer formed of a combination thereof.

Although not shown in the drawings, a reflective layer may be further formed on the conductive layer 180. In this case, the reflective layer reflects downwards a portion of light generated by the active layers 142 and having propagated upwards towards the conductive layer 180. In this case, the nano-structured light-emitting device 100 may be a flip-chip type light-emitting device. In exemplary embodiments, the reflective layer may be formed of a material having high light reflectance, for example, at least one or more of metallic elements such as Ag, $Ag_2O$, Al, Zn, Ti, Rh, Mg, Pd, Ru, etc. In exemplary embodiments, the reflective layer may include a distributed Bragg reflector (DBR). The DBR may have a structure having a plurality of materials of different refractive indexes that are stacked. For example, the DBR may be a conductive DBR in which ITO layers having refractive indexes are stacked. According to another exemplary embodiment, the DBR may be an insulating DBR in which oxide layers having different refractive indexes are alternately stacked.

The plurality of nanostructures 140 can have horn shapes as shown in the drawings but are not limited thereto. The plurality of nanostructures 140 may have pyramid shapes, rod shapes, or combinations thereof.

Figure 2:
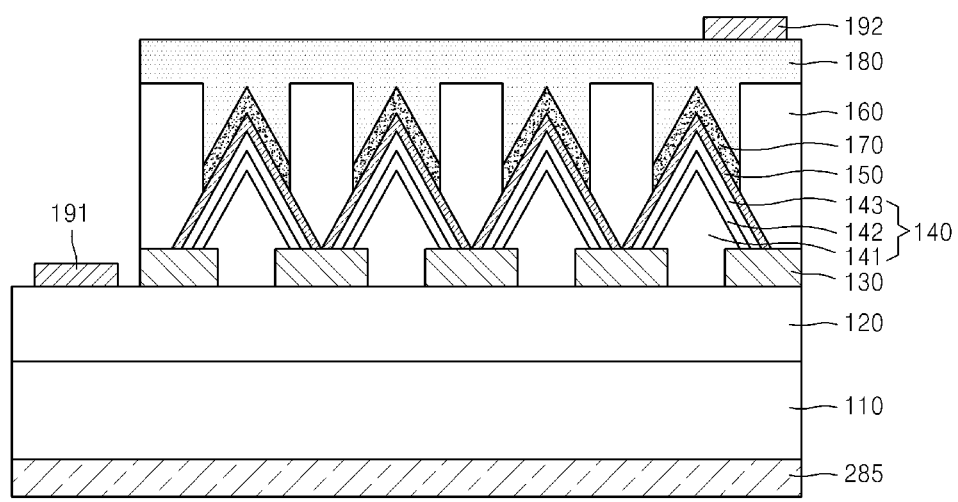
FIG. 2 is a schematic cross-sectional view illustrating a structure of a nano-structured light-emitting device according to another exemplary embodiment of the inventive concepts.

FIG. 2 is a schematic cross-sectional view illustrating a structure of a nano-structured light-emitting device 200 according to another exemplary embodiment of the inventive concepts. The reference numerals of FIG. 2 that are the same as reference numerals of FIGS. 1A and 1B denote the same elements, and thus their repeated descriptions are omitted for convenience.

Referring to FIG. 2, the nano-structured light-emitting device 200 is different from the nano-structured light-emitting device 100 of FIG. 1A in that a reflective layer 285 is formed on a lower surface of a substrate 110. In the nano-structured light-emitting device 200 of FIG. 2, the reflective layer 285 reflects light emitted from nanostructures 140 upwards. In other words, the reflective layer 285 reflects upwards a portion of light that is emitted downwards from active layers 142. In this case, the nano-structured light-emitting device 200 may be a top-emitted type light-emitting device that emits light through a top surface thereof. In exemplary embodiments, the reflective layer 285 may be formed of a material having high light reflectance, for example, at least one or more of metallic elements such as Ag, $Ag_2O$, Al, Zn, Ti, Rh, Mg, Pd, Ru, etc. In exemplary embodiments, the reflective layer 285 may include a DBR. The DBR may have a structure in which a plurality of materials having different refractive indexes are stacked. For example, the DBR may be a conductive DBR in which ITO layers having different refractive indexes are stacked. As another example, the DBR may be an insulating DBR in which oxide layers having different refractive indexes are alternately stacked.

Figure 3:
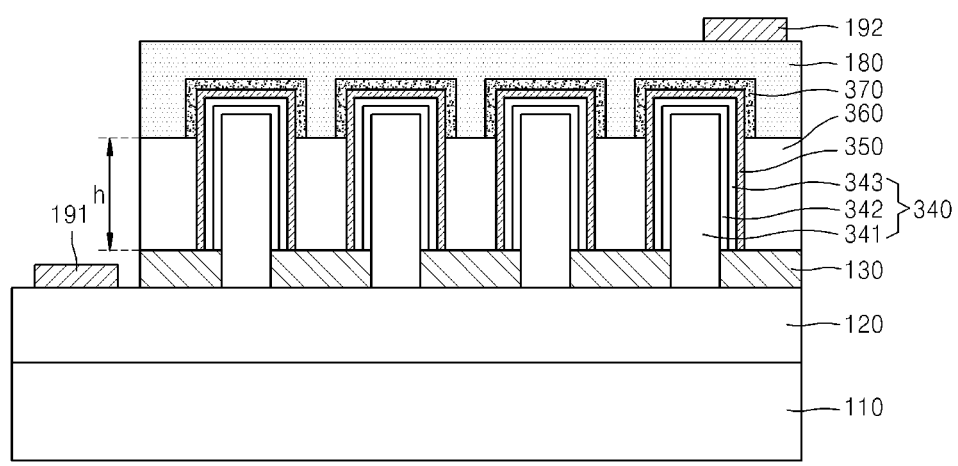
FIG. 3 is a schematic cross-sectional view illustrating a structure of a nano-structured light-emitting device according to another exemplary embodiment of the inventive concepts.

FIG. 3 is a schematic cross-sectional view illustrating a structure of a nano-structured light-emitting device 300 according to another exemplary embodiment of the inventive concepts. The reference numerals of FIG. 3 that are the same as reference numerals of FIGS. 1A and 1B denote the same elements, and thus their repeated descriptions are omitted for convenience.

Referring to FIG. 3, the nano-structured light-emitting device 300 is different from the nano-structured light-emitting device 100 of FIG. 1A in that nanostructures 340 have rod shapes having rectangular cross-sections as shown in FIG. 3.

The nanostructures 340 have rod shapes that are vertically grown from selected areas of the first semiconductor layer 120. Although upper parts of the rod shapes are flat in FIG. 3, the upper parts of the rod shapes may alternatively have polypyramid shapes. The nanostructures 340 may include nanocores 341 that are doped to have a first conductivity type, active layers 342 that are formed on surfaces of the nanocores 341, and second semiconductor layers 343 that are formed on surfaces of the active layers 342 and doped to have a second conductivity type. In other words, the nanostructures 340 may have core-shell structures in which the nanocores 341 are core parts, and the active layers 342 and the second semiconductor layers 343 enclosing the nanocores 341 are shell parts. A material of which the nanostructures 340 are formed may be the same as that used in forming the nanostructures 140 of the nano-structured light-emitting device 100 of FIG. 1A.

A height h of an insulating layer 360 of the nano-structured light-emitting device 300 of FIG. 3 may be adjusted so as to adjust the area of resistant layers 370 that are formed on surfaces of the nanostructures 340 extending above the insulating layer 360. A material of which the insulating layer 360 is formed may be the same as that used in forming the insulating layer 160 of the nano-structured light-emitting device 100 of FIG. 1A.

FIGS. 4A through 4F are cross-sectional views illustrating a method of manufacturing the nano-structured light-emitting devices 100, 200, and 300, according to exemplary embodiments of the inventive concepts. In the present exemplary embodiment, a process of manufacturing the nano-structured light-emitting device 100 of FIG. 1A is described.

Figure 4A:
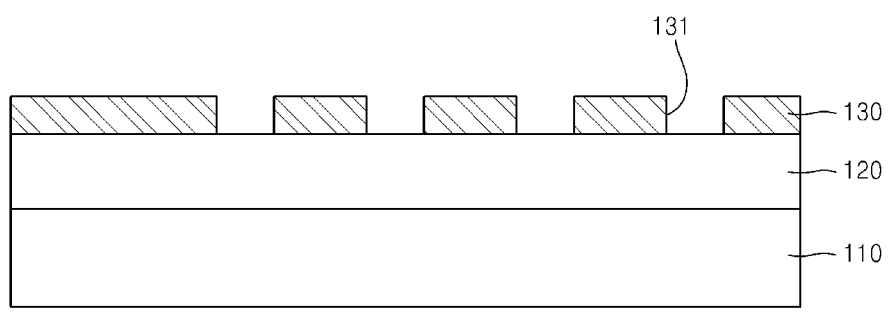
FIGS. 4A through 4F are cross-sectional views illustrating a method of manufacturing nano-structured light-emitting devices, according to an exemplary embodiment of the inventive concepts.

Referring to FIG. 4A, the first semiconductor layer 120 of the first conductivity type and the mask layer 130 are sequentially stacked on the substrate 110. The first semiconductor layer 120 may include a plurality of layers and may be selectively doped to have the first conductivity type. The first semiconductor layer 120 and the mask layer 130 may be formed by using various methods that are generally known as thin film growing methods. For example, an epitaxial deposition method, a metal organic chemical vapor deposition (MOCVD) method, a hydride vapor phase epitaxy (HVPE) method, a molecular beam epitaxy (MBE) method, a metal organic vapor phase epitaxy (MOVPE) method, a halide chemical vapor deposition (HCVD) method, sputtering, an atomic layer deposition (ALD) method, a plasma enhanced CVD (PECVD) method, or the like may be used.

A portion of the mask layer 130 is etched to form at least one through-hole 131. More generally, a plurality of through-holes 131 are formed. The first semiconductor layer 120 may be exposed through the through-holes 131. In exemplary embodiments, to form the through-holes 131, a plurality of photoresist (PR) patterns and/or hard mask patterns (not shown) are formed on the mask layer 130 by using a photolithography process, and the patterns are then used as etch masks to etch the mask layer 130. In exemplary embodiments, nanoimprint lithography may be used to form the through-holes 131.

Figure 4B:
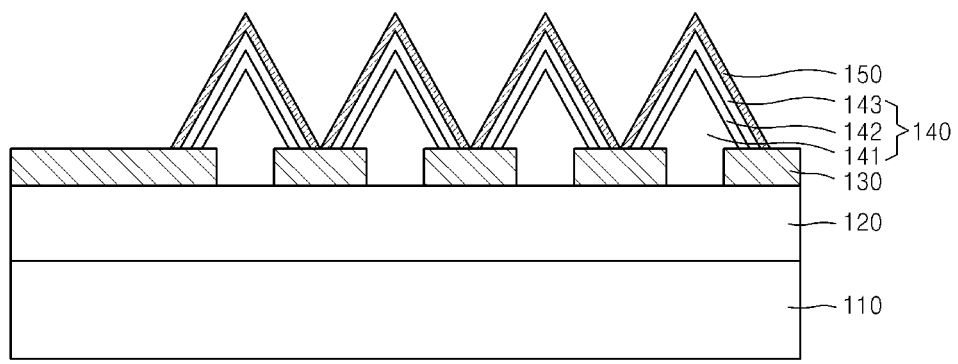

Referring to FIG. 4B, the nanocores 141 are grown from the first semiconductor layer 120 through the through-holes 131, and the active layers 142 and the second semiconductor layers 143 of the second conductivity type are sequentially stacked (e.g., grown) on the surfaces of the nanocores 141. The nanostructures 140 including the nanocores 141, the active layers 142, and the second semiconductor layers 143 may be formed according to the pattern of the mask layer 130. The active layers 142 and the second semiconductor layers 143 may be stacked in parts of the mask layer 130 in which the nanostructures 140 are not formed, and the parts may be removed later. The active layers 142 and the second semiconductor layers 143 may be sequentially stacked on top of the nanocores 141. In exemplary embodiments, the nanocores 141, the active layers 142, and the second semiconductor layers 143 may be formed by using an MOCVD method, an HVPE method, an MBE method, an MOVPE method, an HCVD method, an ALD method, a PECVD method, or the like. In exemplary embodiments, when the nanocores 141 are deposited by using the CVD method, a content of hydrogen in a $H_2/N_2$ carrier gas mixture may be adjusted to adjust shapes of the nanostructures 141. Although the nanostructures 140 have nano-pyramid shapes having triangular cross-sections shown in FIG. 4B, shapes of the nanostructures 140 may vary according to deposition conditions. For example, the nanostructures 140 may have conical shapes or pyramid shapes having apexes on tops thereof or nano-rod shapes having rod-shaped lower parts. After the nanostructures 140 are formed, the electrode layer 150 is formed on the surfaces of the nanostructures 140. The electrode layer 150 may be deposited by using various deposition methods.

Figure 4C:
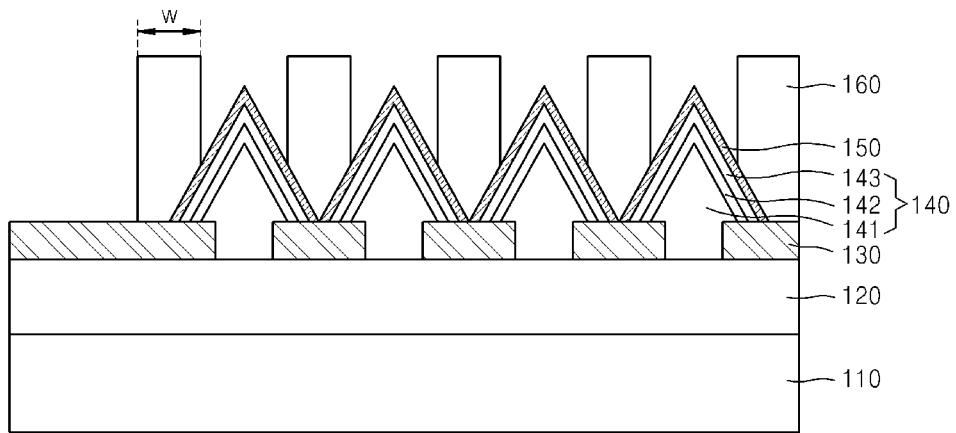

Referring to FIG. 4C, the insulating layer 160 may be formed between the plurality of nanostructures 140. The insulating layer 160 may be formed to include silicon oxide or silicon nitride, for example, one of $SiO_2$, SiN, $TiO_2$, $Si_3N_4$, $Al_2O_3$, TiN, AlN, $ZrO_2$, TiAlN, and TiSiN. To form the insulating layer 160, an insulating material may be fully deposited on the plurality of nanostructures 140 by using various methods. Thereafter, an etch process is performed by using a photolithography process to leave portions of the insulating layer 160 between the nanostructures 140. The etch process may be performed by using various methods, for example, a dry or wet etch process or a combination thereof may be used. The width w of the insulating layer 160 may be variously changed so as to adjust the surface areas of the resistant layers 170 of FIG. 4D that cover the nanostructures 140.

Figure 4D:
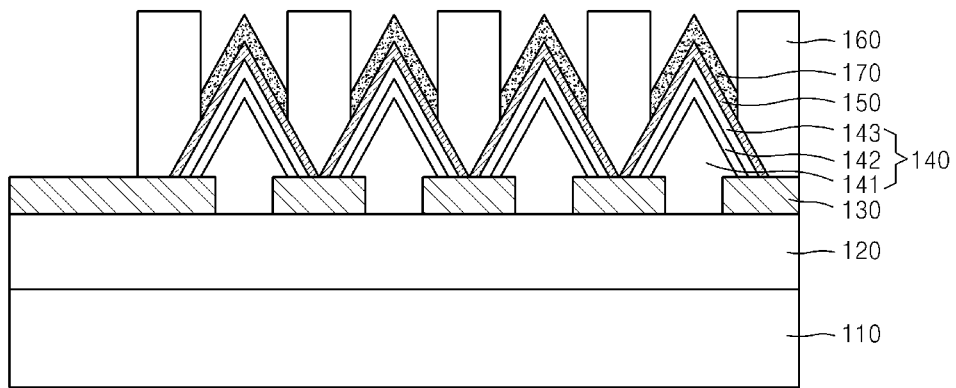

Referring to FIG. 4D, the resistant layers 170 are individually formed on the plurality of nanostructures 140. The resistant layers 170 are formed in the intervals between the insulating layers 160. The plurality of resistant layers 170 are spaced apart from one another, i.e., may be insulated from one another by the insulating layer 160. The resistant layers 170 may be formed to include one of polysilicon, lightly-doped Si, TaN, and silicide. The resistant layers 170 may be deposited by using various deposition methods.

Figure 4E:
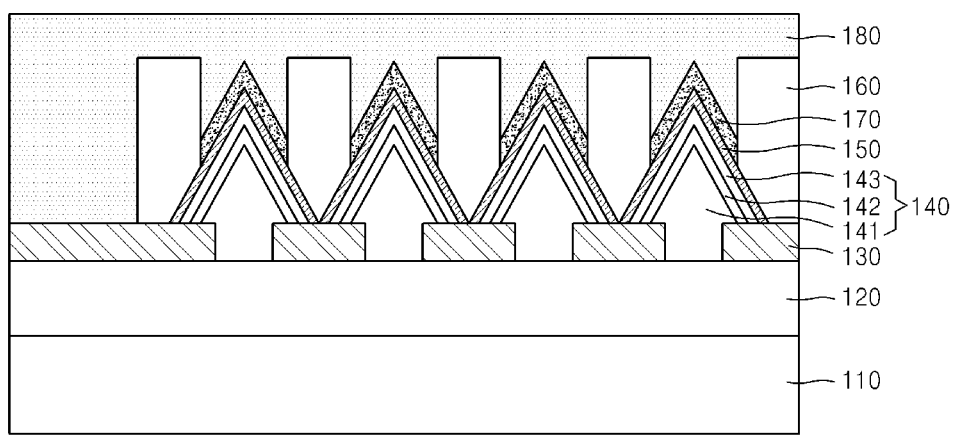

Referring to FIG. 4E, the conductive layer 180 is deposited to cover the resistant layers 170 and the insulating layer 160 that are formed on the mask layer 130 and the plurality of nanostructures 140. The conductive layer 180 may be deposited by using various deposition methods.

Figure 4F:
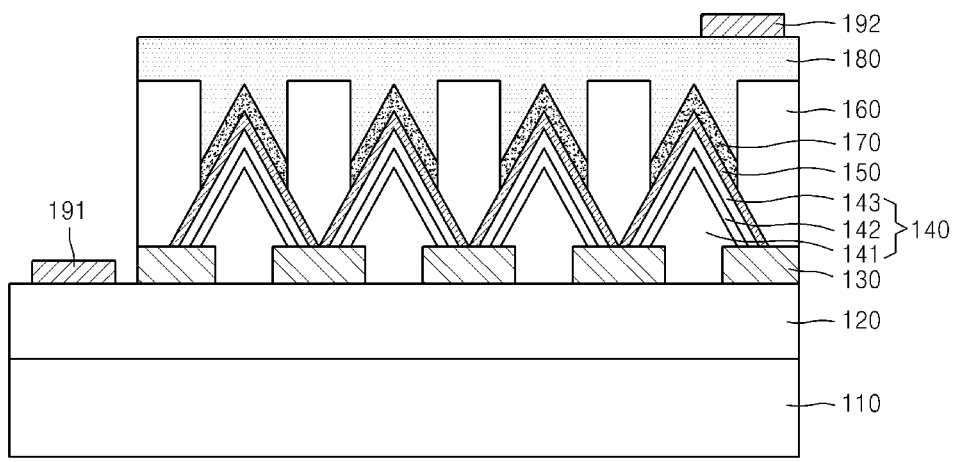

Referring to FIG. 4F, the first and second electrode pads 191 and 192 are formed. To form the first electrode pad 191, a mesa etch may be performed to expose a portion of the first semiconductor layers 120, and the first electrode pad 191 may be deposited on the exposed first semiconductor layer 120. The second electrode pad 192 may be deposited on the conductive layer 180. An electrode structure may be formed in various structures such as a vertical structure, a mesa structure, a vertical-horizontal structure, etc. in consideration of conductivity, a light-emission direction, or the like.

The present exemplary embodiment has described the processes of manufacturing the nano-structured light-emitting device 100 of FIG. 1A and may be variously modified. For example, a process of making the substrate 110 thin or a process of removing the substrate 110 may be additionally included. Also, a process of forming a nuclear growth layer or a buffer layer between the substrate 110 and the first semiconductor layer 120 may be added. Alternatively, a reflective layer may be added to increase light reflection efficiency, for example between the substrate 110 and first semiconductor layer 120.

FIGS. 5A through 5H are cross-sectional views illustrating a method of manufacturing nano-structured light-emitting devices, according to another exemplary embodiment of the inventive concepts. In the present exemplary embodiment, a process of manufacturing the nano-structured light-emitting device 300 of FIG. 3 will be described.

Figure 5A:
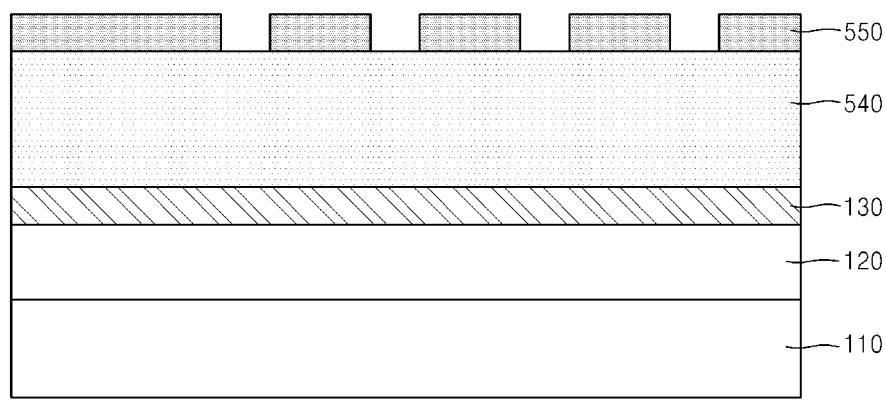
FIGS. 5A through 5H are cross-sectional views illustrating a method of manufacturing nano-structured light-emitting devices, according to another exemplary embodiment of the inventive concepts.

Referring to FIG. 5A, the first semiconductor layer 120, the mask layer 130, and a mold layer 540 are sequentially stacked on the substrate 110.

The mold layer 540 may be formed of various types of insulating materials, for example, SiN, $SiO_2$, etc. The mold layer 540 may be deposited in consideration of heights of the nanostructures 340 of FIG. 3 that will be grown. For example, the mold layer 540 may be deposited to a thickness between hundreds of nanometers and dozens of micrometers. The first semiconductor layer 120 may include a plurality of layers and may be selectively doped to have a first conductivity type. The first semiconductor layer 120 of the first conductivity type, the mask layer 130, and the mold layer 540 may be formed by using various methods that are generally known as thin film growing methods. For example, an MOCVD method, an HVPE method, an MBE method, an MOVPE method, an HCVD method, sputtering, an ALD method, a PECVD method, or the like may be used.

Thereafter, a plurality of PR patterns 550 are formed above the mask layer 130 by using a photolithography process.

Figure 5B:
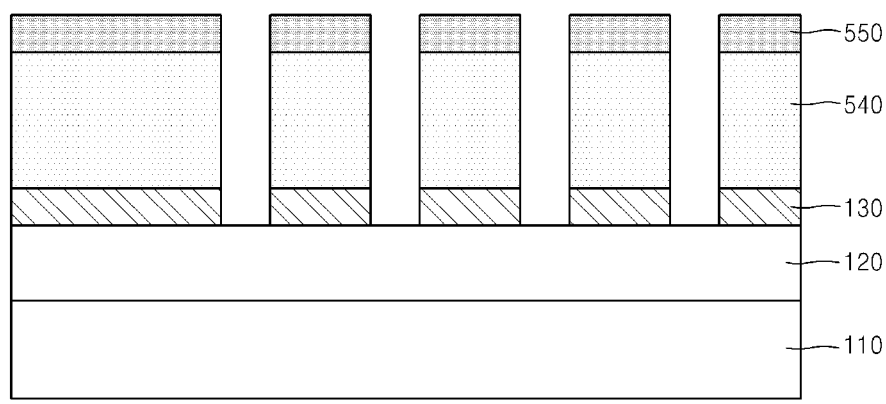

Referring to FIG. 5B, the plurality of PR patterns 550 are used as etch masks to etch the mold layer 540 and the mask layer 130. Openings in the plurality of PR patterns 550 may have circular shapes, polygonal shapes, or combinations thereof. Sizes of the PR patterns 550 may be variously changed.

The etch process may be performed by using various methods, for example, a dry or wet etch process or a combination thereof may be used.

Figure 5C:
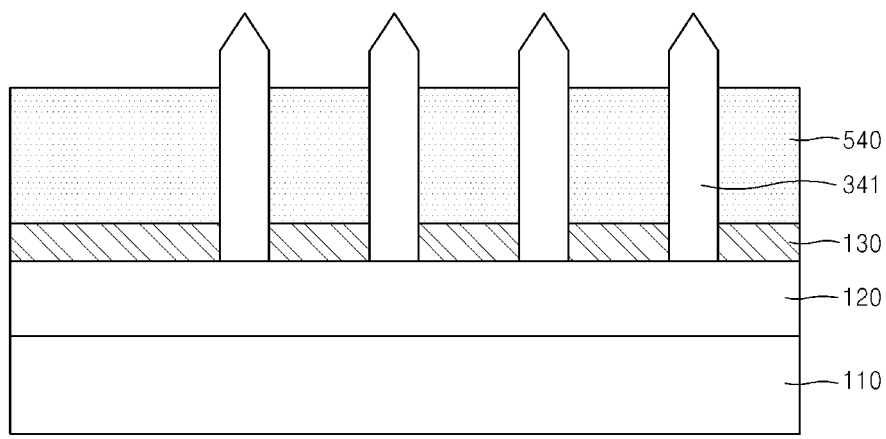

Referring to FIG. 5C, after the etch process is performed, a process of removing the PR patterns 550 may be performed, and a cleaning work may be performed for subsequent processes. The nanocores 341 are grown from the first semiconductor layer 120 through etched portions of the mold layer 540 and the mask layer 130. The nanocores 341 may be grown by using an MOCVD method, an HVPE method, an MBE method, an MOVPE method, an HCVD method, an ALD method, a PECVD method, or the like. In exemplary embodiments, the nanocores 341 may be grown to protrude above the mold layer 540.

Figure 5D:
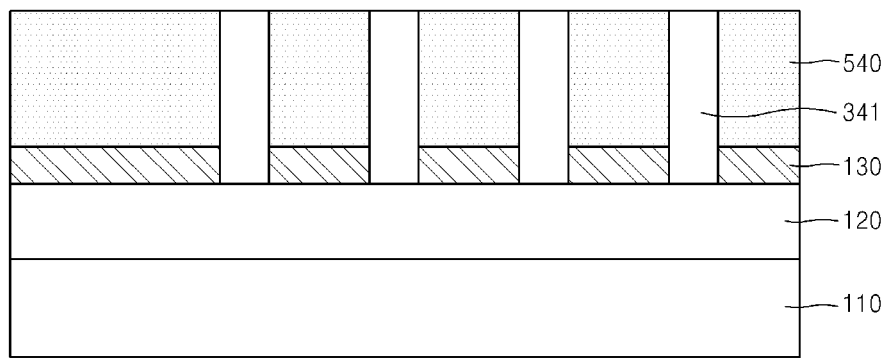

Referring to FIG. 5D, an upper planarization process may be performed to planarize upper surfaces of the nanocores 341 and/or an upper surface of the mold layer 540. In exemplary embodiments, the upper planarization process may be performed by chemical mechanical polishing (CMP). Heights of the nanocores 341 may be adjusted through the upper planarization process. The upper planarization process is optional and may not be performed.

Figure 5E:
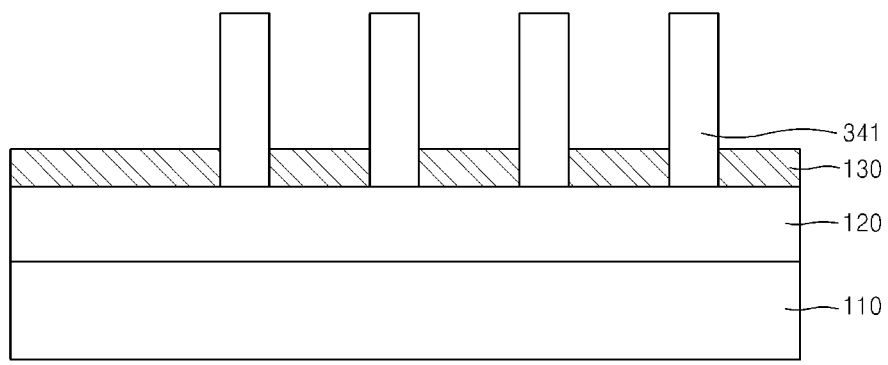

Referring to FIG. 5E, after the nanocores 341 are grown, a process of removing the mold layer 540 is performed. Various types of etch processes may be performed to etch the mold layer 540. For example, a dry or wet etch process or a combination thereof may be used.

Figure 5F:
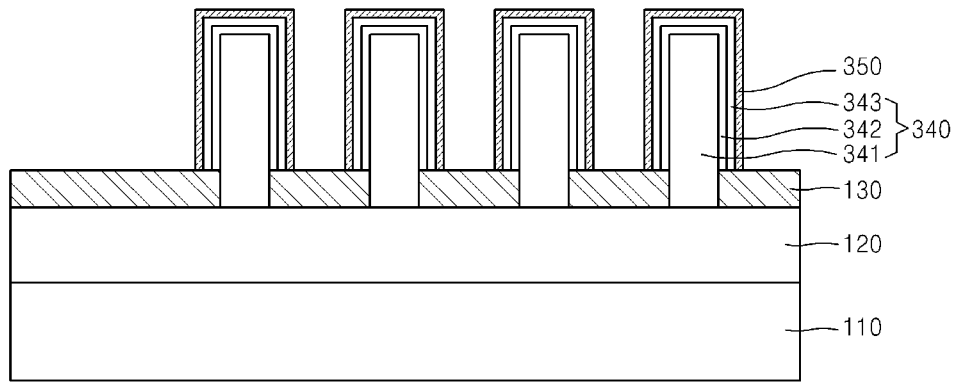

Referring to FIG. 5F, the active layers 342 and the second semiconductor layers 343 of the second conductivity type are sequentially stacked on surfaces of the nanocores 341 to complete the nanostructures 340. The active layers 342 and the second semiconductor layers 343 may be deposited by using the methods described with reference to the formation of the activate layers 142 and the second semiconductor layers 143 in FIG. 4B. After the nanostructures 340 are formed, a plurality of electrode layers 350 are formed such that each electrode layer 350 is formed on the surfaces of a corresponding nanostructure 340. The electrode layers 350 may be deposited by using various deposition methods.

Figure 5G:
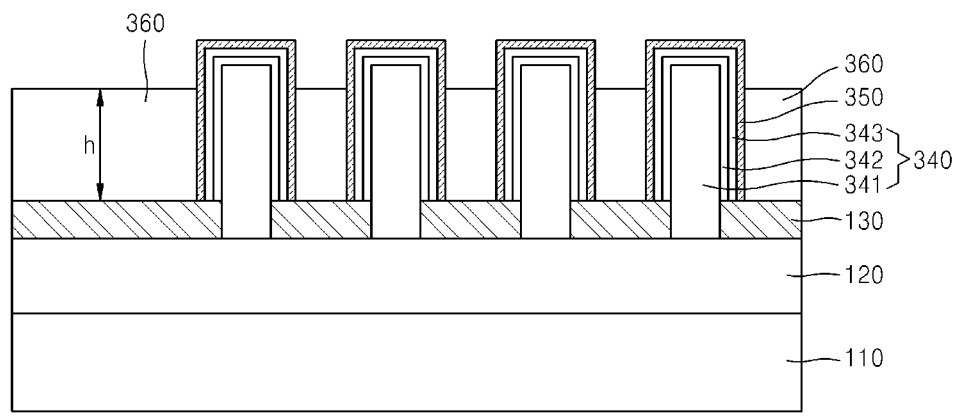

Referring to FIG. 5G, the insulating layer 360 is formed between nanostructures 340 of the plurality of nanostructures 340. To form the insulating layer 360, an insulating material may be deposited to fill gaps between the plurality of nanostructures 340. Deposition conditions may be changed to adjust the height h of the insulating layer 360.

Figure 5H:
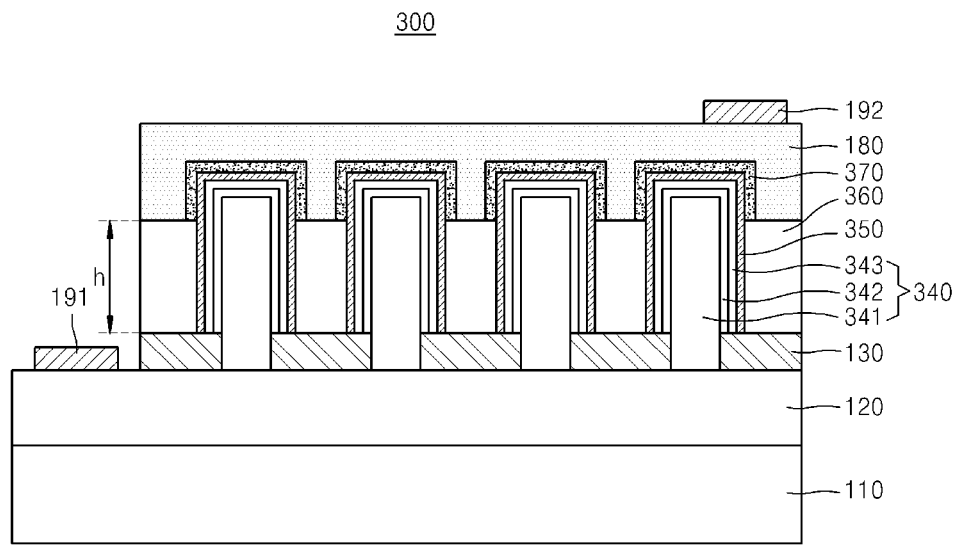

Referring to FIG. 5H, the resistant layers 370 are individually formed on the plurality of nanostructures 340. The resistant layers 370 are formed on portions of the plurality of nanostructures 340 that extend above the insulating layer 360. The resistant layers 370 are deposited in shapes that enclose surfaces of the nanostructures 340 positioned above the insulating layer 360. The resistant layers 370 may be formed to include one of polysilicon, lightly-doped Si, TaN, and silicide.

The conductive layer 180 is deposited to cover the resistant layers 370 that are formed on the insulating layer 360 and the plurality of nanostructures 340.

The first and second electrode pads 191 and 192 may be formed by using a method as described with reference to electrode pads 191 and 192 of FIG. 4F.

The present exemplary embodiment has described the processes of manufacturing the nano-structured light-emitting device 300 of FIG. 3 and may be variously modified. For example, a process of making the substrate 110 thin or a process of removing the substrate 110 may be additionally included, and a process of forming a nuclear growth layer or a buffer layer may be added. A reflective layer may be added to increase light reflection efficiency, and an uneven structure may be formed on the substrate 110. Alternatively, after the mold layer 540 is etched, a buffer layer or an anti-diffusion layer may be added on an etched surface.

Figure 6A:
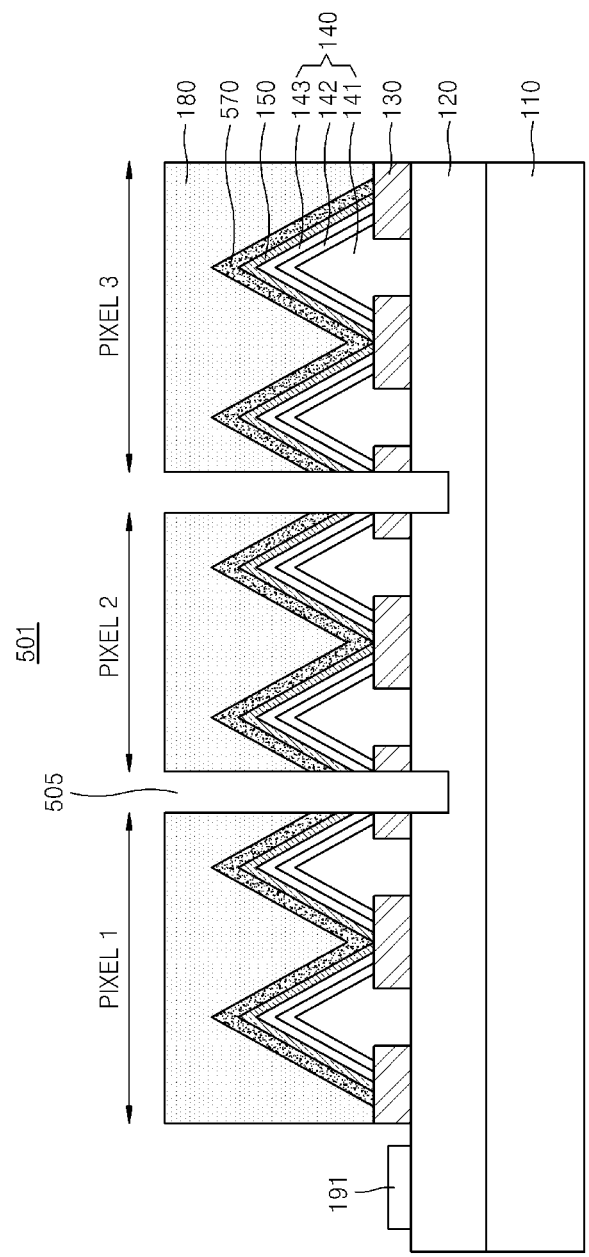
FIG. 6A is a schematic cross-sectional view illustrating a structure of a nano-structured light-emitting device according to another exemplary embodiment of the inventive concepts.

FIG. 6A is a schematic cross-sectional view illustrating a structure of a nano-structured light-emitting device 501 according to another exemplary embodiment of the inventive concepts. The reference numerals of FIG. 6A that are the same as reference numerals of FIGS. 1A and 1B denote the same elements, and thus their repeated descriptions are omitted herein for convenience.

Referring to FIG. 6A, the nano-structured light-emitting device 501 is different from the nano-structured light-emitting device 100 of FIG. 1A in that trenches 505 are formed in areas of the nano-structured light-emitting device 501.

The trenches 505 may be formed between the plurality of nanostructures 140, i.e., may be formed in shapes to form grooves in the first semiconductor layer 120 from an upper surface of the conductive layer 180 through the resistant layers 170, the nanostructures 140, and the mask layer 130.

The plurality of nanostructures 140 may be classified or isolated into groups by the trenches 505. The nanostructures 140 that are classified or isolated into one group may form one pixel. The one pixel may include tens of thousands of nanostructures.

The conductive layer 180 of the nano-structured light-emitting device 501 is divided by the trenches 505, and thus a different voltage may be supplied to each pixel. Although not shown in FIG. 6A, an electrode pad may be formed on each pixel to supply a voltage to the conductive layer 180 in each pixel.

Resistant layers 570 of the nano-structured light-emitting device 501 respectively connect nanostructures 140 of individual pixels in series. Although a current is concentrated onto the nanostructures 140, damage to pixels may be reduced by introduction of the resistant layers 570. Although a particular pixel is damaged, the pixels are separated from one another, and thus damage to other pixels of the nano-structured light-emitting device 501 may be prevented.

Although an insulating layer that insulates the resistant layers 570 from one another is not shown in FIG. 6A, the insulating layer 160 may be added between the plurality of nanostructures 140 as shown in FIG. 1A to connect the resistant layers 570 to one another in series in each of the nano structures 140.

Figure 6B:
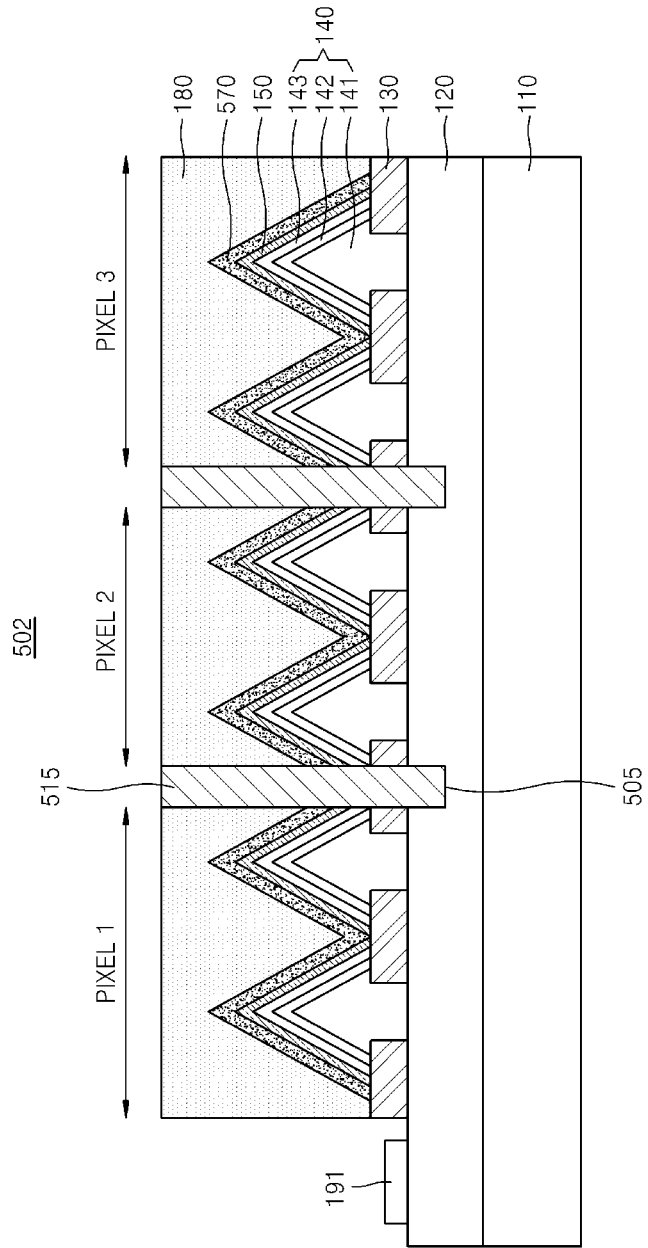
FIG. 6B is a schematic cross-sectional view illustrating a structure of a nano-structured light-emitting device according to another exemplary embodiment of the inventive concepts.

FIG. 6B is a schematic cross-sectional view illustrating a structure of a nano-structured light-emitting device 502 according to another exemplary embodiment of the inventive concepts. The nano-structured light-emitting device 502 of FIG. 6B is different from the nano-structured light-emitting device 501 of FIG. 6A in that a filling layer 515 is formed of an insulating material in the trenches 505. The filling layer 515 may be formed of $SiO_2$, SiN, or Silicon On Glass (SOG).

Figure 6C:
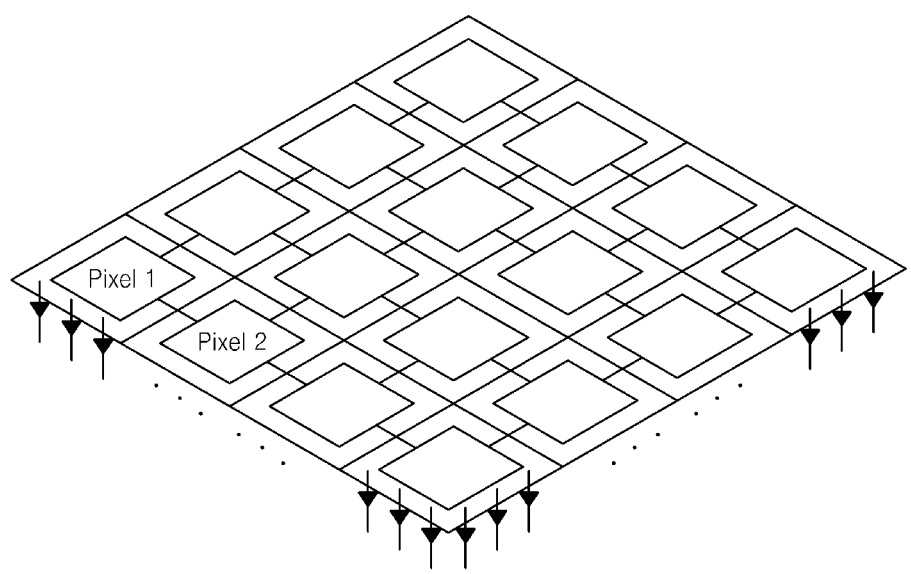
FIG. 6C is a schematic view illustrating the nano-structured light-emitting device of FIG. 6A.

FIG. 6C is a schematic view illustrating a device having a plurality of nanostructures 140 that are formed or organized into pixels. Pixels have square shapes in FIG. 6C but may have various shapes such as circular shapes, polygonal shapes, etc. in other embodiments. Each of the pixels may include tens of thousands of nanostructures 140 illustratively shown as diode circuit elements in the figure. The resistant layers 570 may be connected to each other in series in each of the pixels (e.g., as shown in FIG. 6A) to prevent damage to the pixels caused by a concentration of a current. The pixels are electrically connected to one another, and thus a defect in one pixel does not cause whole defects in the nano-structured light-emitting devices 501 and 502.

Figure 7:
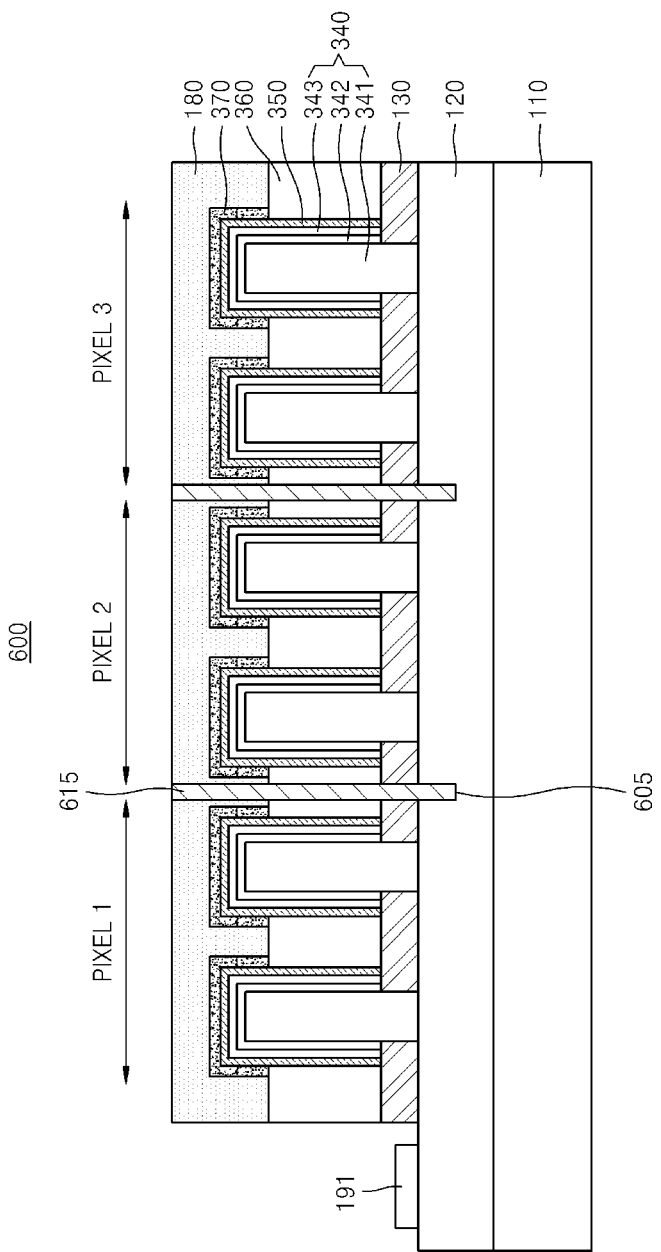
FIG. 7 is a schematic cross-sectional view illustrating a structure of a nano-structured light-emitting device according to another exemplary embodiment of the inventive concepts.

FIG. 7 is a schematic cross-sectional view illustrating a structure of a nano-structured light-emitting device 600 according to another exemplary embodiment of the inventive concepts. The reference numerals of FIG. 7 that are the same as reference numerals of FIGS. 1A and 3 denote the same elements, and thus their repeated descriptions are omitted herein for convenience.

Referring to FIG. 7, the nano-structured light-emitting device 600 is different from the nano-structured light-emitting device 300 of FIG. 3 in that trenches 605 are formed in areas of the nano-structured light-emitting device 600.

The trenches 605 may be formed between the plurality of nanostructures 340, i.e., may be formed in shapes to form grooves in the first semiconductor layer 120 from the upper surface of the conductive layer 180 through the resistant layers 370, the nanostructures 340, and the mask layer 130. Widths and depths of the trenches 605 may be variously modified and are not limited thereto.

A filling layer 615 may be further formed in the trenches 605. The filling layer 615 may be formed of an insulating material, for example, $SiO_2$, SiN, or SOG.

FIGS. 8A through 8D are cross-sectional views illustrating a method of manufacturing the nano-structured light-emitting devices 501, 502, and 600, according to exemplary embodiments of the inventive concepts.

Figure 8A:
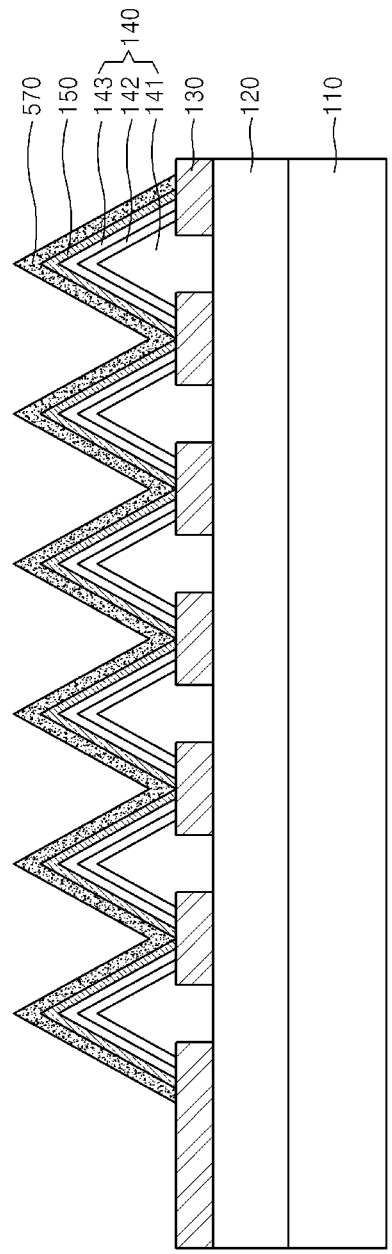
FIGS. 8A through 8D are cross-sectional views illustrating methods of manufacturing a nano-structured light-emitting device according to exemplary embodiments of the inventive concepts.

Referring to FIG. 8A, the first semiconductor layer 120, the mask layer 130, the nanostructures 140, and the electrode layer 150 are sequentially formed on the substrate 100 as described with reference to FIGS. 4A and 4B. Thereafter, the resistant layers 570 are deposited on a whole surface of the electrode layer 150. In exemplary embodiments, a CVD process may be used to form the resistant layers 570.

Figure 8B:
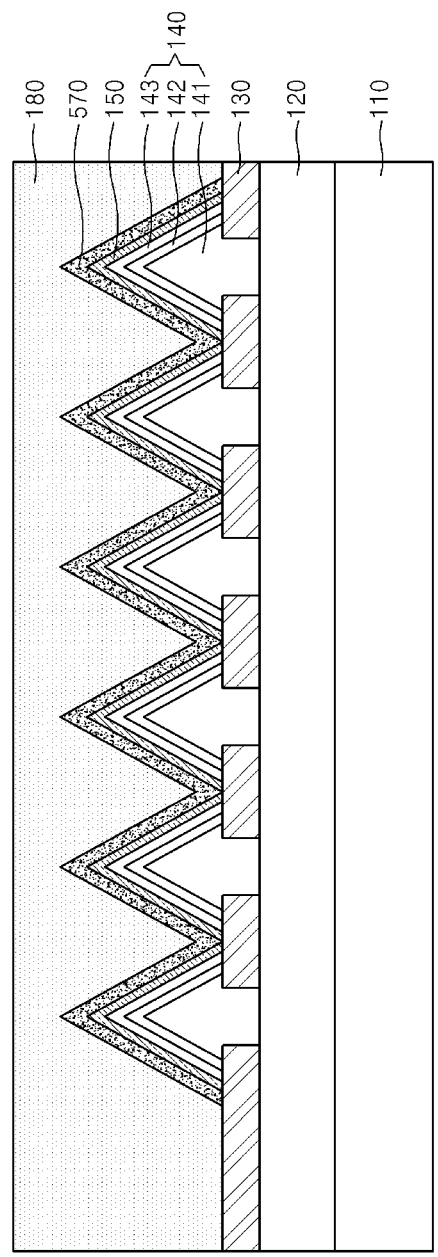

Referring to FIG. 8B, after the resistant layers 570 are formed, the conductive layer 180 is deposited to cover the mask layer 130 and the resistant layers 570. The conductive layer 180 may be deposited by using various deposition methods.

Figure 8C:
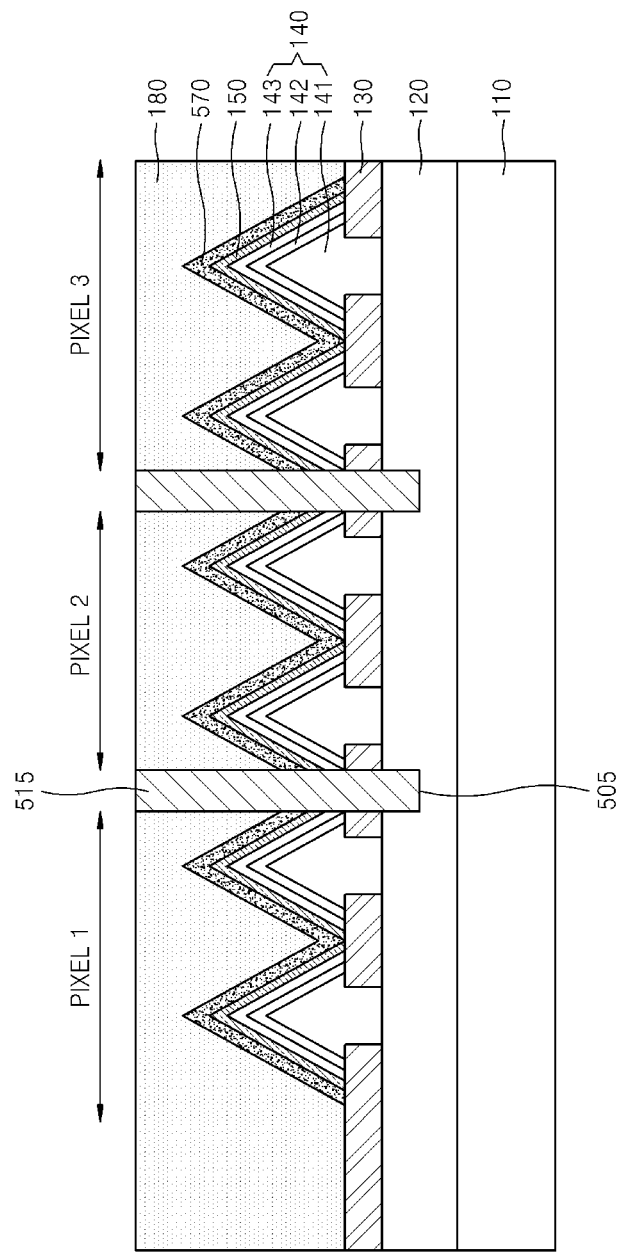

Referring to FIG. 8C, the plurality of nanostructures 140 are classified into groups, and trenches 505 are formed between the groups. An etch process or a laser drilling technique may be used to form the trenches 505. In exemplary embodiments, the trenches 505 may be formed to have widths of several micrometers. In exemplary embodiments, the trenches 505 may be formed to have depths of several micrometers from an upper surface of the first semiconductor layer 120. However, the widths and depths of the trenches 505 are not limited thereto and may be formed in various sizes.

Figure 8D:
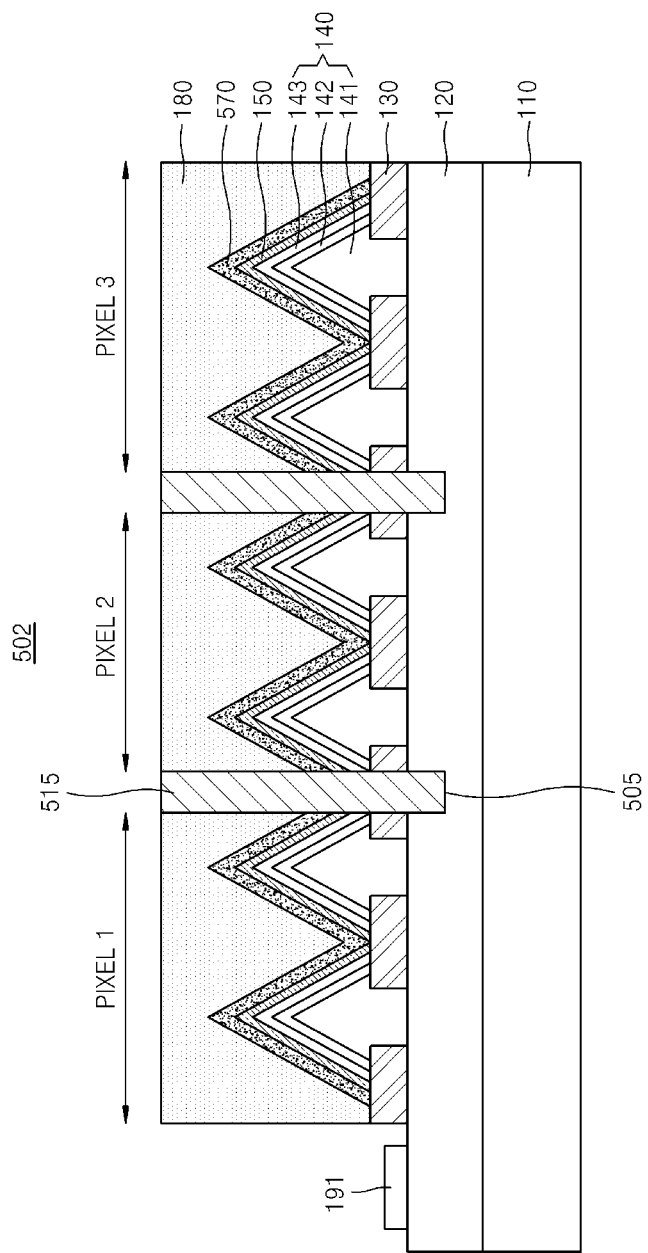

Referring to FIG. 8D, the first electrode pad 191 is formed. To form the first electrode pad 191, a mesa etch may be performed to expose a portion of the first semiconductor layer 120, and the first electrode pad 191 may be deposited on the exposed first semiconductor layer 120. Although not shown in FIG. 8D, an electrode pads that are each connected to the conductive layer 180 of a corresponding pixel may be further deposited.

The present exemplary embodiment has described the processes of manufacturing the nano-structured light-emitting device 502 of FIG. 6B and may be variously modified. Also, the manufacturing method described with reference to FIGS. 5A through 5F may be used as a method of growing the nanostructures 140.

Figure 9:
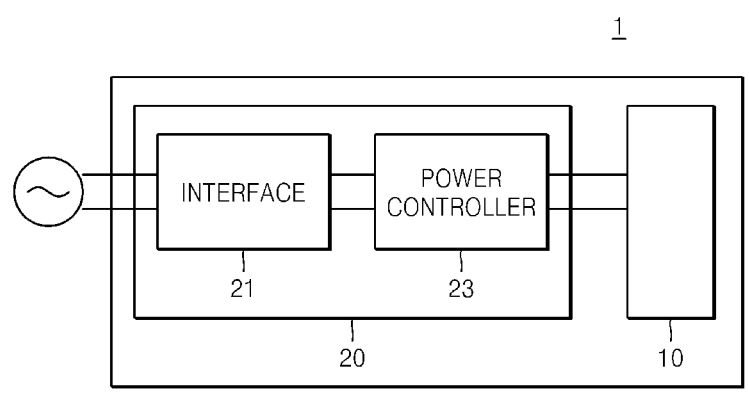
FIG. 9 is a block diagram illustrating a light-emitting device system using a nano-structured light-emitting device, according to an exemplary embodiment of the inventive concepts.

FIG. 9 is a block diagram of a light-emitting device system 1 using a nano-structured light-emitting device, according to an exemplary embodiment of the inventive concepts. Referring to FIG. 9, the light-emitting device system 1 includes a light-emitting device package 10 and a power supply unit 20 that supplies power to the light-emitting device package 10.

The nano-structured light-emitting devices 100, 200, 300, 501, 502, and 600 according to the above-described exemplary embodiments may be used in the light-emitting device package 10.

The power supply unit 20 may include an interface 21 that receives power and a power controller 23 that controls the power supplied to the light-emitting device package 10. The interface 21 may include a fuse that cuts off overcurrent and an electromagnetic wave shielding filter that shields an electromagnetic interference signal. The power may be supplied from an external source or an embedded battery. If alternating current (AC) power is input as power, the power controller 23 may further include a rectifier that converts the alternating current into direct current (DC) and a constant voltage controller that converts an alternating voltage into a voltage appropriate for the light-emitting device package 10. If power is a DC source (a battery) having a voltage appropriate for the light-emitting device package 10, the rectifier or the constant voltage controller may be omitted. Also, if a device such as an AC-LED may be used as a light-emitting device of the light-emitting device package 10, AC power may be supplied to the light-emitting device package 10. Even in this case, the rectifier or the constant voltage controller may be omitted.

The light-emitting device system 1 may be used as a lighting system in an LED-tube, flat panel light, or a lamp and may be used in a liquid crystal display (LCD) system of a portable phone, a backlight unit system of a TV, a car or the like.

While the inventive concepts have been particularly shown and described with reference to exemplary embodiments thereof, it will be understood that various changes in form and details may be made therein without departing from the spirit and scope of the following claims.

What is claimed is:

1. A nano-structured light-emitting device comprising:
   a first semiconductor layer of a first conductivity type;
   a plurality of nanostructures disposed on the first semiconductor layer and each comprising a nanocore, and an active layer and a second semiconductor layer of a second conductivity type that enclose surfaces of the nanocore;
   an electrode layer enclosing and covering the plurality of nanostructures, the electrode layer having a first surface facing the plurality of nanostructures; and
   a plurality of resistant layers disposed on a second surface of the electrode layer opposite to the first surface and each corresponding to a respective nanostructure of the plurality of nanostructures.

2. The nano-structured light-emitting device of claim 1, wherein the resistant layers are disposed to cover portions of the nanostructures and are spaced apart from one another so as not to contact each other.

3. The nano-structured light-emitting device of claim 1, wherein the resistant layers each have a resistance value that is greater than or equal to resistance values of the nanostructures.

4. The nano-structured light-emitting device of claim 1, further comprising:
   an insulating layer disposed between adjacent nanostructures to electrically insulate the resistant layer of one nanostructure from the resistant layers of other nanostructures.

5. The nano-structured light-emitting device of claim 4, wherein the resistant layers are disposed only on portions of electrode layers that do not contact the insulating layer.

6. The nano-structured light-emitting device of claim 1, further comprising:
   a conductive layer disposed on the plurality of resistant layers to connect the plurality of nanostructures to one another in parallel.

7. The nano-structured light-emitting device of claim 1, wherein the nanostructures are electrically interconnected into a plurality of groups corresponding to a plurality of pixels,
   wherein the pixels are separated from one another by trenches.

8. The nano-structured light-emitting device of claim 7, wherein an insulating material is disposed in the trenches.

9. The nano-structured light-emitting device of claim 1, further comprising:
   a mask layer disposed on an upper surface of the first semiconductor layer and comprising through-holes,
   wherein the nanocores protrude from the through-holes.

10. The nano-structured light-emitting device of claim 6, further comprising:
    a first electrode pad electrically connected to the first semiconductor layer; and
    a second electrode pad electrically connected to the conductive layer.

11. The nano-structured light-emitting device of claim 1, further comprising:
    a substrate disposed underneath the first semiconductor layer.

12. The nano-structured light-emitting device of claim 1, further comprising:
a reflective layer configured to reflect light emitted from the active layers.

13. The nano-structured light-emitting device of claim 1, wherein the nanostructures have polypyramid shapes or rod shapes.

14. The nano-structured light-emitting device of claim 1, wherein the nano-structured light-emitting device includes different nanostructures operative to emit light having different wavelength ranges.

15. A nano-structured light-emitting device comprising:
a first semiconductor layer doped to have a first conductivity type;
a mask layer disposed on the first semiconductor layer and comprising a plurality of through-holes;
a plurality of nanostructures protruding through the plurality of through-holes and each comprising a nanocore that is doped to have the first conductivity type, an active layer that encloses surfaces of the nanocore, and a second semiconductor layer that is doped to have a second conductivity type;
an electrode layer enclosing and covering the plurality of nanostructures, the electrode layer having a first surface facing the plurality of nanostructures; and
a plurality of resistant layers disposed on a second surface of the electrode layer opposite to the first surface, each resistant layer respectively corresponding to a nanostructure of the plurality of nanostructures, and electrically insulated from one another.

16. The nano-structured light-emitting device of claim 15, wherein each active layer comprises a quantum well structure that is stacked as $In_aGa_{1-a}N/Al_xIn_yGa_{1-x-y}N$ ($0 \le a,x,y \le 1$, $x+y<1$).

* * * * *